(12) United States Patent
Adachi et al.

(10) Patent No.: US 9,198,333 B2
(45) Date of Patent: Nov. 24, 2015

(54) SHIELD COVER AND SHIELD STRUCTURE

(75) Inventors: Hideomi Adachi, Kosai (JP); Hidehiko Kuboshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 117 days.

(21) Appl. No.: 13/879,280

(22) PCT Filed: Oct. 20, 2011

(86) PCT No.: PCT/JP2011/074737
§ 371 (c)(1),
(2), (4) Date: Apr. 12, 2013

(87) PCT Pub. No.: WO2012/053662
PCT Pub. Date: Apr. 26, 2012

(65) Prior Publication Data
US 2013/0199836 A1 Aug. 8, 2013

(30) Foreign Application Priority Data
Oct. 22, 2010 (JP) .................................. 2010-236986

(51) Int. Cl.
*H05K 9/00* (2006.01)
(52) U.S. Cl.
CPC .............. *H05K 9/0007* (2013.01); *H05K 9/002* (2013.01)
(58) Field of Classification Search
CPC ....................................................... H05K 9/00
USPC .......... 174/384, 350–397, 520–565; 439/130; 361/600–678, 679.46–679.54, 361/688–723
See application file for complete search history.

(56) References Cited

U.S. PATENT DOCUMENTS

| | | | | |
|---|---|---|---|---|
| 2,785,387 | A * | 3/1957 | Batcheller | 439/290 |
| 3,383,455 | A * | 5/1968 | Kerley, Jr. | 174/565 |
| 4,597,624 | A * | 7/1986 | Lax et al. | 439/607.47 |
| 4,929,195 | A * | 5/1990 | Seidoh | 439/607.45 |
| 5,911,605 | A * | 6/1999 | Wooldridge et al. | 439/790 |
| 6,811,404 | B2 * | 11/2004 | Doshita et al. | 439/34 |
| 6,814,615 | B2 * | 11/2004 | Laub et al. | 439/585 |
| 6,890,211 | B2 * | 5/2005 | Inagaki et al. | 439/544 |
| 6,991,493 | B2 * | 1/2006 | Matsui et al. | 439/579 |
| 7,151,222 | B1 * | 12/2006 | Jetton | 174/68.3 |
| 7,381,898 | B2 * | 6/2008 | Ide | 174/72 A |
| 7,414,197 | B2 * | 8/2008 | Ortiz et al. | 174/74 R |
| 7,503,776 | B1 * | 3/2009 | Pavlovic et al. | 439/98 |
| 7,530,847 | B2 * | 5/2009 | Siems | 439/607.41 |
| 8,057,258 | B2 * | 11/2011 | Kawaguchi et al. | 439/585 |
| 8,513,540 | B2 * | 8/2013 | Kuan | 174/350 |
| 2003/0062177 | A1 * | 4/2003 | Yagi et al. | 174/35 C |
| 2003/0156954 | A1 * | 8/2003 | Kimura et al. | 417/410.5 |
| 2005/0090132 | A1 * | 4/2005 | Miyazaki | 439/130 |

(Continued)

FOREIGN PATENT DOCUMENTS

JP 2003-115223 A 4/2003

*Primary Examiner* — Courtney Smith
*Assistant Examiner* — Rashen E Morrison
(74) *Attorney, Agent, or Firm* — Sughrue Mion, PLLC (57) ABSTRACT

The present invention is to provide a shield cover and a shield structure which can be improved according to an electromagnetic shielding means. The shield cover by processing a conductive plate slidably includes a front shield portion, a back shield portion, a side shield portion, connections, an entry and a receiving space, and covers a wiring harness 11 as a shield object. The shield cover is formed into a U-shape in a cross-section. The shield structure includes the shield cover and a wall-shaped shield cover engaged with the shield cover.

7 Claims, 7 Drawing Sheets

(56) References Cited

U.S. PATENT DOCUMENTS

| | | | |
|---|---|---|---|
| 2006/0232942 A1* | 10/2006 | Nakatsu et al. | 361/710 |
| 2006/0243476 A1* | 11/2006 | Ortiz et al. | 174/75 C |
| 2006/0278423 A1* | 12/2006 | Ichikawa et al. | 174/72 A |
| 2009/0023345 A1* | 1/2009 | Matsumoto et al. | 439/720 |
| 2011/0130023 A1* | 6/2011 | Kataoka et al. | 439/271 |
| 2011/0250801 A1* | 10/2011 | Kataoka et al. | 439/668 |
| 2012/0077360 A1* | 3/2012 | Hattori et al. | 439/153 |
| 2012/0238147 A1* | 9/2012 | Matsumoto et al. | 439/660 |
| 2013/0153291 A1* | 6/2013 | Adachi et al. | 174/70 R |
| 2013/0196525 A1* | 8/2013 | Takamatsu | 439/232 |
| 2013/0199836 A1* | 8/2013 | Adachi et al. | 174/384 |
| 2013/0248246 A1* | 9/2013 | Oga | 174/72 A |
| 2013/0250524 A1* | 9/2013 | Augsburger | 361/728 |
| 2013/0316573 A1* | 11/2013 | Uno et al. | 439/573 |
| 2014/0291017 A1* | 10/2014 | Kuji et al. | 174/72 A |
| 2014/0318860 A1* | 10/2014 | Kuji et al. | 174/72 A |
| 2014/0322965 A1* | 10/2014 | Kuji et al. | 439/527 |

* cited by examiner

SHIELD COVER AND SHIELD STRUCTURE

FIELD OF THE INVENTION

The present invention relates to a shield cover for slidably covering a shield object, and a shield structure including the shield cover.

BACKGROUND OF THE INVENTION

In an electric vehicle or a hybrid vehicle, it is known that an electromagnetic wave is generated from electric wires of high-current/high-voltage which are connected to a motor mounted on the electric vehicle or the hybrid vehicle. So it is important to provide electromagnetic shielding means which can prevent effects of the electromagnetic wave and of external electromagnetic wave. One example on the electromagnetic shielding means is disclosed in the patent document 1. Hereafter, Japanese Patent Application 2003-115223 will be described briefly.

Figure 7:
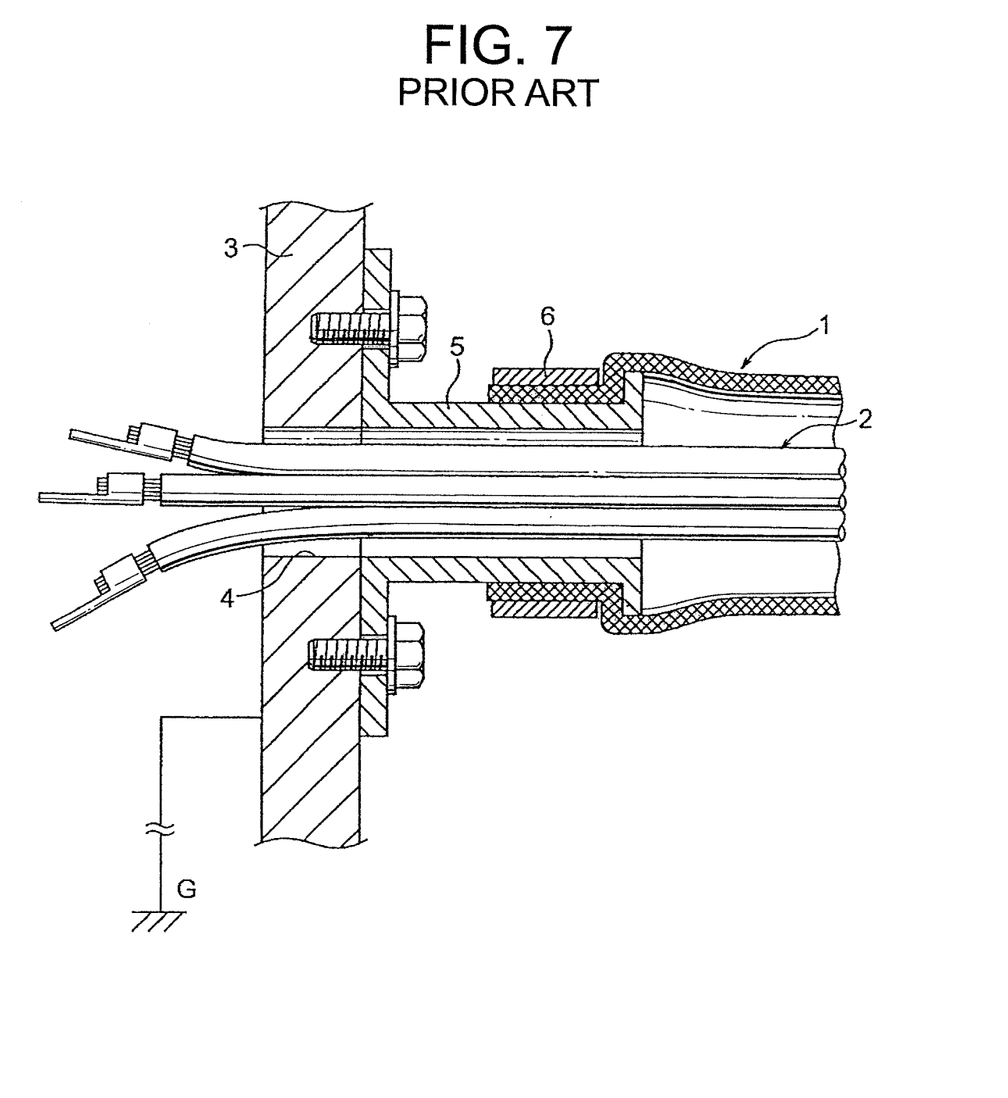
FIG. 7 is a cross-sectional view showing a conventional shield structure.

In FIG. 7, a reference sign 1 shows a braid (shield member) formed into a tubular shape by braiding conductive metallic element wires. In the braid 1, a plurality of electric wires 2 are inserted. The electric wires 2 are covered with the braid 1 in one lump. The electric wires 2, such as, are inserted into a hole 4 formed in a shield case 3. The shield case 3 is a metallic case member having conductive property. A shield shell 5 has conductive property, and fixed to the shield case 3. A terminal portion of the braid 1 and the shield shell 5 are fixed by crimped with a crimping ring 6.

In the conventional art mentioned above, as for electromagnetic shielding means, the electric wires 2 must be inserted into the braid 1 braided with the tubular shape. Further, in the terminal portion of the braid 1, for example, a raveling process must be performed. Furthermore, the terminal portion of the braid 1 must be connected and fixed to the shield shell 5 by crimping. In addition, the shield shell 5 must be connected to the shield case 3 and fixed thereto.

Meanwhile, in the electric vehicle or the hybrid vehicle, density growth of equipment and the like is progressing. However, in the conventional art described above, enough work space can not be maintained in a front side of the electric wires 2. Furthermore, in the electromagnetic shielding means, there is a problem that it is difficult to perform this work.

Accordingly, an object of the present invention is to provide a shield cover and a shield structure which can improve work efficiency in an electromagnetic shielding means.

SUMMARY OF THE INVENTION

In order to achieve the above object, according to the present invention, a shield cover formed by processing a conductive metal plate has a side shield portion, a front shield portion connected to a first end of the side shield portion, a back portion connected to a second end of the side shield portion and opposed to the front shield portion, a connection connected to a conductive portion, a shield object member entry opening at the other end of the front shield portion, and a shield object member receiving space connected to the shield object member entry and formed between the front shield portion and the back portion. The shield cover slidably covers shield object.

Preferably, the back portion is formed as at least one of a reinforced portion against the side shield portion and a sliding guide portion when the shield cover is slid.

Preferably, the back portion formed in a desired size and a desired arrangement is a back shield portion.

Preferably, a shield structure has a shield cover described in claim 1, 2, or 3, and an other shield cover engaged with the shield cover so as to cover the shield object member entry of the shield cover.

Preferably, according to the shield structure of the present invention, the other shield cover is formed into a wall shape.

Preferably, the other shield cover is a second shield cover having a structure of the shield cover, and the second shield cover being formed slidable in a direction opposite to a sliding direction of the shield cover.

Preferably, the second shield cover covers second shield object.

According to the present invention, in order to shield an electromagnetic ray, since a braided wire is not used, it is not necessary to process a terminal section and cumbersome work can be reduced. Further, an inserting work which inserts a plurality of wires into the braided wire is not required every time when covering the shield object. The shield structure of the present invention has only to slide and move the shield cover. Therefore, as compared to a conventional shield structure, the shield cover of the present invention can improve work. Additionally, even if there is not enough space in front of the shield object, work of the electromagnetic shielding means can be performed by sliding and moving the shield cover. As a result, work can be improved.

Further, according to the present invention, the better shield cover can be provided.

Furthermore, according to the present invention, the shield structure in order to shield electromagnetic ray has the above shield cover. Therefore, work of the shield cover can be improved in comparison with before. In addition, the shield object member entry of the shield cover is covered with the other shield cover, and the circumference of the shield object member is covered. Therefore, shielding performance can be improved.

The above and other objects and features of this invention will become more apparent from the following description taken in conjunction with the accompanying drawings.

DESCRIPTION OF THE PREFERRED EMBODIMENT

The present invention is an invention adopting a shield cover according to an electromagnetic shielding means. The shield cover is formed by processing a metallic plate having conductive property, and is a structure covering slidably a shield object member. The shield cover is formed into a U-shape in a cross-section. A shield structure includes the shield cover and another shield cover engaged with such shield cover. As the other shield cover, preferably the shape of the shield cover is formed in a wall shape. Furthermore, a second shield cover having structure of the shield cover may be formed as the other shield cover. As the shield object, such as, a wiring harness is effective.

[First Embodiment]

Figure 1:
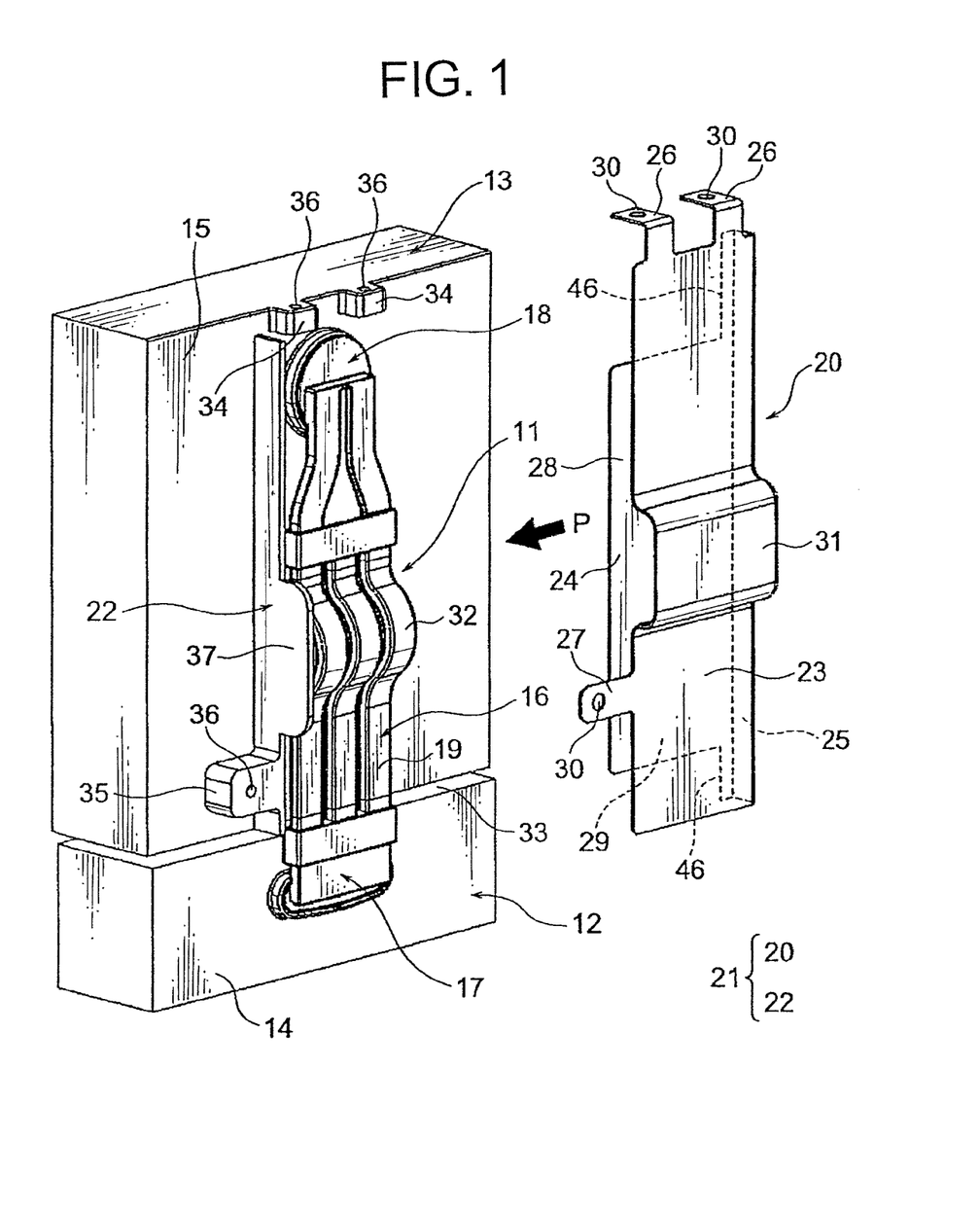
FIG. 1 is a perspective view of a shield cover and shield structure in the present invention (namely, a perspective view showing a state which is not covered with a shield cover)
Figure 2:
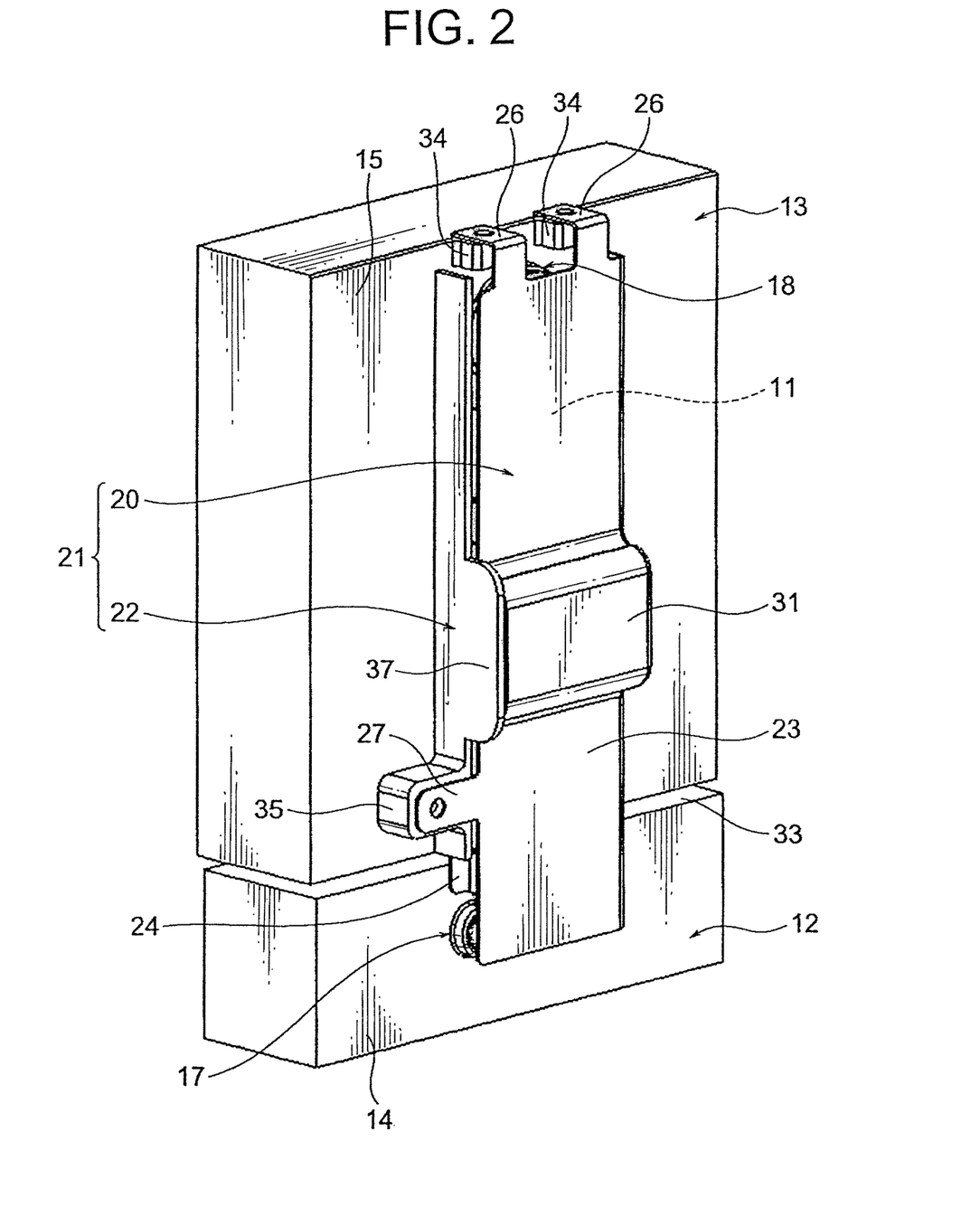
FIG. 2 is a perspective view showing a state covered with the shield cover as against FIG. 1.

Hereafter, first embodiment will be explained with reference to the drawings. FIG. 1 is a perspective view showing a shield cover and shield structure in the present invention. More specifically, FIG. 1 is a perspective view showing a state which is not covered with a shield cover. FIG. 2 is a perspective view showing a state covered with the shield cover as against FIG. 1.

In FIGS. 1 and 2, the reference sign 11 shows a wiring harness. The wiring harness 11 is arranged in a hybrid vehicle (not shown) or an electric vehicle (not shown). With the following, one example in the hybrid vehicle will be explained (also, in the electric vehicle, action and effect of the present invention described below are the same as the hybrid vehicle. In addition, the present invention is not limited to the hybrid vehicle or the electric vehicle, and the present invention can be applied to normal vehicle and so on.)

The hybrid vehicle drives two engines of an engine (not shown) and a motor unit 12 by mixing the two engines. In the motor unit 12, an electric power is supplied from a battery (not shown) or a battery pack (not shown) via an inverter unit 13. The engine, the motor unit 12 and the inverter unit 13 are installed in an engine room (not shown) located in a position in which front wheels and so on are arranged in the first embodiment of the present invention. Furthermore, the battery is located in a room of the vehicle which is located at the rear of the engine room or in the rear section (not shown) of the vehicle in which the rear-wheel and the like are arranged.

The motor unit 12 and the inverter unit 13 are connected with the above high-voltage wiring harness. Furthermore, the battery not shown and the inverter unit 13 are connected with the high-voltage wiring harness (not shown). The wiring harness is arranged from the engine room to an under floor which is a ground surface of a floor panel.

The motor unit 12 includes a motor and a generator. The inverter unit 13 includes an inverter and a converter. The motor unit 12 is formed as a motor assembly including a shield case 14. Also, the inverter unit 13 is formed as an inverter assembly including a shield case 15. The battery (not shown) is Ni-MH battery types or Li-ion battery types, and is modularized. Furthermore, an electric storage device such as a capacitor can be used. The battery not shown is not limited when it is available for the hybrid vehicle or the electric vehicle.

In the first embodiment of the present invention, the inverter unit 13 is arranged directly above the motor unit 12 and fixed thereto. That is, the inverter unit 13 and the motor unit 12 are closely positioned. So, they are such installed condition, the wiring harness 11 is short.

The wiring harness 11 includes a harness body 16, a motor side connector 17 arranged in one end of the harness body 16, and an inverter connector 18 arranged in the other end thereof. The harness body 16 includes a plurality of high-voltage conducting paths 19 (conducting path) arranged in the same plane at certain intervals. In this first embodiment, three high-voltage conducting paths 19 are arranged.

The motor side connector 17 is inserted into the shield case 14 of the motor unit 12, and is electrically connected thereto in the interior thereof. Similarly, the inverter side connector 18 is inserted into the shield case 15, and is electrically connected thereto in the interior thereof.

The high-voltage conducting path 19 includes a conductor (not shown) and an insulator (reference sign is not shown) coating the conductor. In the first embodiment, the conductor is formed by pressing a conductive metal plate (made of copper, copper alloy, or aluminum). Namely, the conductor is formed into a bus bar shape (namely, bad plate shape) having the predefined conductor width and thickness.

Meanwhile, the conductor is not limited to the bus bar shape. For example, the conductor may be formed by twisting an element wire, and the cross-sectional shape may be a rectangular shape or a round shape (for example, rectangular single conductor or round single conductor).

In the above wiring harness 11, the electromagnetic shielding means is performed by the shield structure 21 including the shield cover 20 of the present invention.

In an explanation discussed below, the wiring harness 11 corresponds to shield object described in claims.

In the embodiments, the shield structure 21 includes the above shield cover 20 and a wall-shaped shield cover 22 (another shield cover). The wall-shaped shield cover 22 is integrally formed in the shield case 15 of the inverter unit 13, and is structure different from the shield cover 20. The shield cover 20 is fixed to the shield case 15 and the wall-shaped shield cover 22, respectively, and is electrically connected thereto. Regarding to the fixing, in the first embodiment, a screw not shown is used (this is one example). In addition, attachment of the wall-shaped shield cover 22 is optional.

The shield cover 20 is formed by pressing a conductive metal plate. The shield cover 20 is formed so that the wiring harness 11 which is connected to the motor unit 12 and the inverter unit 13 can be slidably covered with the shield cover 20.

More specifically, the shield cover 20 has a front shield portion 23, a back shield portion 24 (back portion), a side shield portion 25, connections 26, 27, and an entry 28 (shield object member entry) a receiving space 29 (shield object member receiving space), and is formed into a U-shape in cross-section. The front shield portion 23 and the back shield portion 24 are opposed to each other. The side shield portion 25 connects a right edge (one end) of the front shield portion 23 with a right edge (one end) of the back shield portion 24. The connections 26, 27 are connected to connection stands 34, 35 (described below) of the shield case 15 and the wall-shaped shield cover 22, respectively. The entry 28 opens at a left edge (the other end) of the frond shield portion 23 and a left edge (the other end) of the back shield portion 24. The receiving portion 29 is connected to the entry 28, and formed between the front shield portion 23 and the back shield portion 24.

As discussed previously, the cross-section of the shield cover 20 is formed into the U-shaped shape. Therefore, by sliding the shield cover 20 from an arrow P direction in FIGs, the wiring harness 11 can be covered with the shield cover 20. The shield cover 20 is formed so that a front surface of the wiring harness 11, a back surface thereof and a right side surface can be consecutively covered with the shield cover 20. In addition, directions of "up and down" and "right and left" described in this embodiment are one example.

The front shield portion 23 and the back shield portion 24 are arranged and formed so that the front surface of the wiring harness 11 and the back surface thereof are sandwiched between the front shield portion 23 and the back shield portion 24. Furthermore, the side shield portion 25 is arranged and formed so that the right side surface of the wiring harness 11 is covered with the side shield portion 25.

The front shield portion 23 is formed so that the whole front surface of the wiring harness 11 can be covered with the front shield portion 23. In an upper edge of such the front shield portion 23, two connections 26 are respectively coupled to the upper edge of the front shield portion 23 and arranged therein. In the lower side of the left edge, a connection 27 is coupled to the lower side and arranged therein. The connections 26, 27 are formed as a connecting fixed portion. The connections 26, 27 are formed into a reed shape. In each connections 26, 27, a screw hole 30 is formed. The screw hole 30 passes through each connections 26, 27.

In an intermediate position of the front shield portion 23, a projection 31 is formed. The projection 31 is made to conform to a flexion 32 arranged in the high-voltage conducting path 19 of the wiring harness 11. When the flexion 32 is not arranged, there is no need to form the projection 31.

The back shield portion 24 is formed so that the back surface of the wiring harness 11 can be covered with the back shield portion 24. More specifically, the back shield portion 24 can cover the back surface of the wiring harness 11 arranged between the motor side connector 17 and the inverter side connector 18. Furthermore, the back shield portion 24 is formed with a size closing a gap 33 between the shield case 14 of the motor unit 12 and the shield case 15 of the inverter unit 13.

In the shield case 15 of the inverter unit 13, the wall-shaped shield cover 22 covering the left side surface of the wiring harness 11 is projected and formed (The wall-shaped shield cover 22 may be assembled later). Also, the connection stands 34, 35 are projected and formed. The shield case 15 and the wall-shaped shield cover 22 have conducting properties. In this embodiment, the back shield portion 24 is arranged in contact with the shield cases 14, 15. Furthermore, the back shield portion 24 has a function of a sliding guide portion 49 discussed below.

The side shield portion 25 is a band-like part vertically extending. One end (first end) of the side shield portion 25 is connected to the front shield portion 23, and the other end (second end) thereof is connected to the back shield portion 24.

Two the connection stands 34 are arranged in the upper edge of the shield case 15 and formed therewith. On the other hand, the connection stand 35 is connected with a lower portion of the wall-shaped shield cover 22 and arranged therein. In such connection stands 34, 35, a screw hole 36 is formed, respectively.

The forming surface of the screw hole 36 is formed in a flat so that the connection stands 26, 27 are able to slide.

The wall-shaped shield cover 22 is engaged with the entry 28 of the shield cover 20 (for example, engagement in which the wall-shaped shield cover 22 abuts on the left edge of the front shield portion 23 and the left edge of the back shield portion 24).

The reference sign 37 in the wall-shaped shield cover 22 shows a projection projecting in accordance with the shape of the projection 31 of the shield cover 20.

In the above structure and composition, as shown in FIG. 1, the shield cover 20 is slid and moved from the arrow P direction to the wiring harness 11 which is connected to the motor unit 12 and the inverter unit 13 and covers the left side surface of the wiring harness 11 with the wall-shaped shield cover 22 projecting from the shield case 15. And then, the connections 26, 27 are connected and fixed to the connection stands 34, 35 with a screw (not shown). Thereafter, as shown in FIG. 2, the wiring harness 11 is covered with the shield cover 20 and the wall-shaped shield cover 22. That is, the circumference of the wiring harness 11 is covered with the shield cover 20 and the wall-shaped shield cover 22. Thereby, the electromagnetic shielding means is finished.

Thus, as explained in reference to FIGS. 1 and 2, in regard to the electromagnetic shielding means, the shield structure 21 without the use of a conventional braided wire is provided. Therefore, by adopting such shield structure 21 including the shield cover 20, it is not necessary to process a terminal section of the conventional braid wire and cumbersome work can be reduced. Furthermore, an inserting work which inserts a plurality of wires into the braided wire is not required every time when covering the wiring harness 11. The shield structure 21 of the present invention has only to slide and move the shield cover 20. Therefore, as compared to a conventional shield structure, the shield cover and the shield structure of the present invention can improve work.

Furthermore, the entry 28 of the shield cover 20 is covered with the wall-shaped shield cover 22 of the shield structure 21. As a result, since the circumstance of the wiring harness 11 is covered, shielding performance can be improved.

In addition, as discussed previously, the shield cover 20 is only slid and moved. Therefore, even if there is not enough space in a front side of the wiring harness 11, work of the electromagnetic shielding means can be performed easily.

[Second Embodiment]

Figure 3:
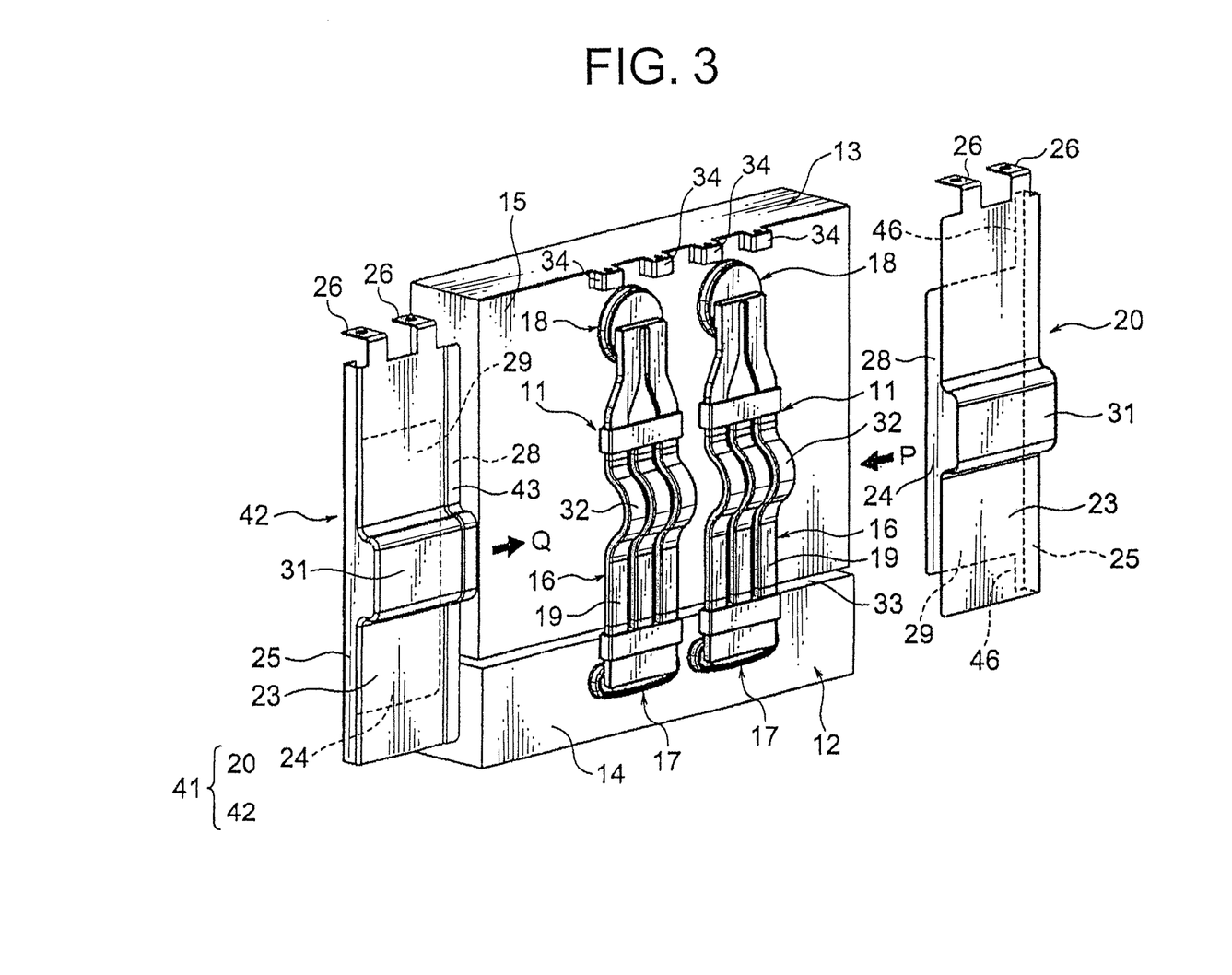
FIG. 3 is a perspective view showing the shield cover and the shield structure in another embodiment of the present invention (namely, a perspective view showing a state which is not covered with the shield cover and a second shield cover)
Figure 4:
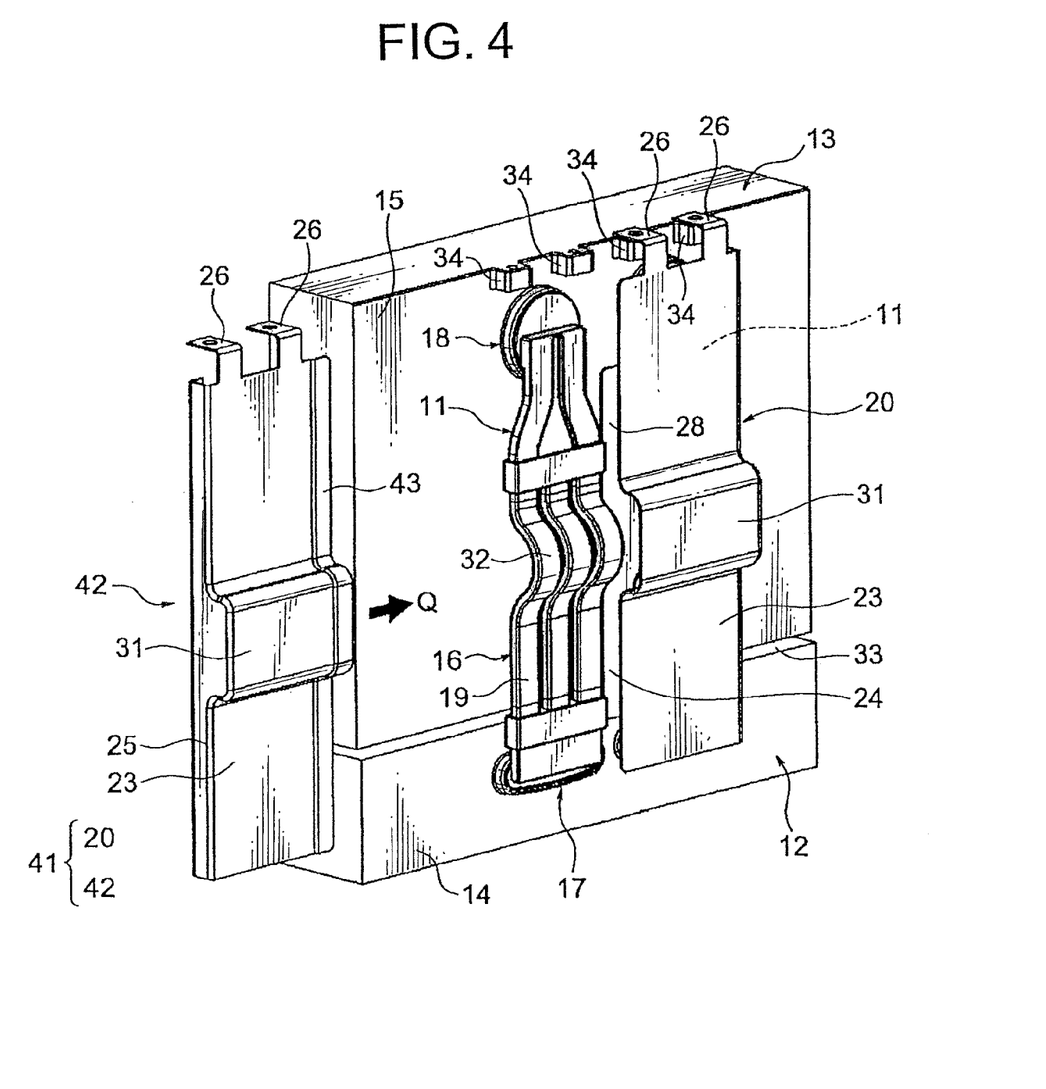
FIG. 4 is a perspective view showing a state covered with the shield cover as against FIG. 3.
Figure 5:
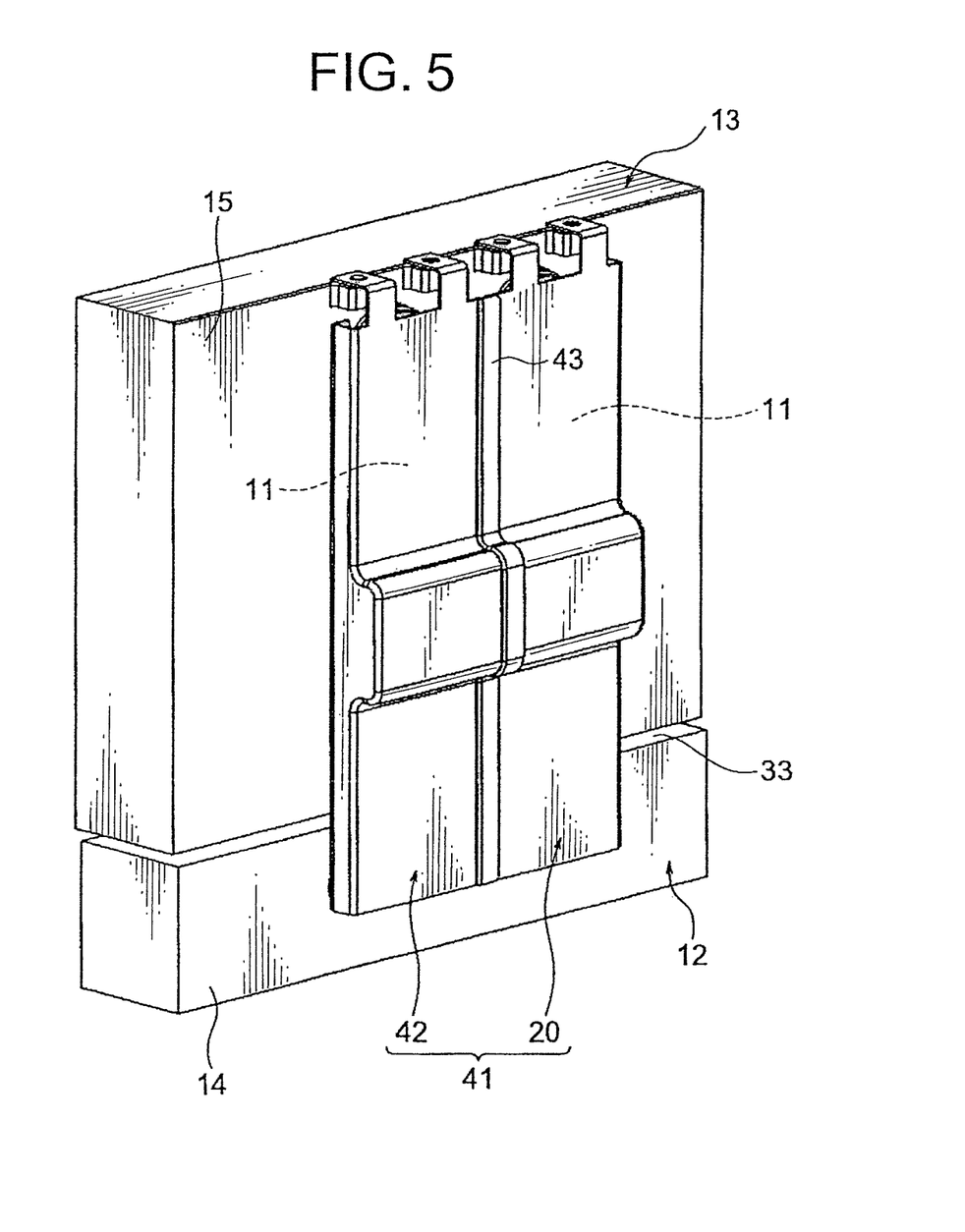
FIG. 5 is a perspective view showing a state covered with the second shield cover as against FIG. 4.

Hereafter, a second embodiment will be explained with reference to the drawings. FIG. 3 is a perspective view showing a shield cover and shield structure in another embodiment of the present invention. More specifically, FIG. 3 is a perspective view showing a state which is not covered with a shield cover and a second shield cover. FIG. 4 is a perspective view showing a state covered with the shield cover as against FIG. 3. FIG. 5 is a perspective view showing a state covered with the second shield cover as against FIG. 4. Incidentally, for some elements same with those of the first embodiment, same reference numerals are used and explanations are omitted.

In FIGS. 3-5, two wiring harnesses 11 are connected to the motor unit 12 and the inverter unit 13, respectively. The two wring harnesses 11 is spaced at predetermined space and arranged side by side. A shield structure 41 as the electromagnetic shielding means against the two wiring harnesses 11 includes the shield cover 20 being basically the same as the first embodiment and a second shield cover 42 (another shield cover) engaged with the entry 28 of the shield cover 20.

In the shield cover 20 of the second embodiment, the connection 27 (see FIG. 1) provided in the first embodiment is not arranged. Furthermore, in the shield case 15 of the inverter unit 13, the wall-shaped shield cover 22 (see FIG. 1) and the connection stand 35 (see FIG. 1) are not arranged. In addition, the number of connection stands in the shield case 15 increases from two to four.

The shield structure 41 is constructed so that the right side wiring harness 11 is covered with the shield cover 20 by sliding and moving the shield cover 20 from the arrow P direction and the left side wiring harness 11 (corresponding to second shield object member) is covered with the second shield cover 42 by sliding and moving the second shield cover 42 from an arrow Q direction. Hereafter, the second shield cover 42 will be explained.

The second shield cover 42 is formed by pressing a conductive metal plate. The second shield cover 42 is formed in common with the shield cover 20. More specifically, the second shield cover 42 has the front shield portion 23, the back shield portion 24 (back portion), the side shield portion 25, the connection 26, the entry 28 (shield object member entry) and the receiving space 29 (shield object member receiving space), and is formed into a U-shape in cross-section. The front shield portion 23 and the back shield portion 24 are opposed to each other. The side shield portion 25 connects a left edge (the other end) of the front shield portion 23 with a left edge (the other end) of the back shield portion 24. The connection 26 is connected to a connection stand 34 (described below) of the shield case 15, and fixed thereto. The entry 28 opens at a right edge (one end) of the frond shield portion 23 and a right edge (one end) of the back shield portion 24. The receiving portion 29 is connected to the entry 28, and formed between the front shield portion 23 and the back shield portion 24. The second shield cover 42 has the same function as the shield cover 20.

In the right edge of the front shield portion 23 of the second shield cover 42, an engaging portion 43 which is overlapped and engaged with the left edge of the front shield portion 23 of the shield cover 20 is formed. The engaging portion 43 is formed so that the entry 28 of the shield cover 20 is covered.

In the above structure and composition, as shown in FIG. 3, the shield cover 20 is slid and moved from the arrow P direction to the wiring harnesses 11 which is connected to the motor unite 12 and the inverter unit 13 (see FIG. 4), and the shield cover 42 is slid and moved from the arrow Q direction to the wiring harness 11 (see FIG. 4). And then, the connection 26 is connected and fixed to the corresponding connection stand 34 with a screw (not shown). Thereafter, as shown in FIG. 5, the circumference of the wiring harness 11 is covered with the shield cover 20 and the second shield cover 42. Thereby, the electromagnetic shielding means is finished.

Thus, as explained in reference to FIGS. 3-5, in regard to the electromagnetic shielding means, the shield structure 41 without the use of a conventional braided wire is provided. Therefore, by adopting such shield structure 41 including the shield cover 20 and the second shield cover 42, it is not necessary to process a terminal section of the conventional braid wire. Therefore, by adopting such shield structure 41 including the shield cover 20 and the second shield cover 42, it is not necessary to process a terminal section such as the conventional braid wire. Furthermore, an inserting work which inserts a plurality of wires into the braided wire is not required every time when covering the wiring harness 11. The shield structure 41 of the present invention has only to slide and move the shield cover 20 and the second shield cover 42. Therefore, as compared to a conventional shield structure, the shield structure of the present invention can be improved.

The entry 28 of the shield cover 20 is covered with the second shield cover 42 of the shield structure 41. As a result, since the circumstance of the wiring harness 11 is covered, shielding performance can be enough ensured.

Additionally, as discussed previously, the shield cover 20 and the second shield cover 42 are only slid and moved. Therefore, even if there is not enough space in a front side of the wiring harness 11, work of the electromagnetic shielding means can be performed easily.

[Third Embodiment]

Figure 6A:
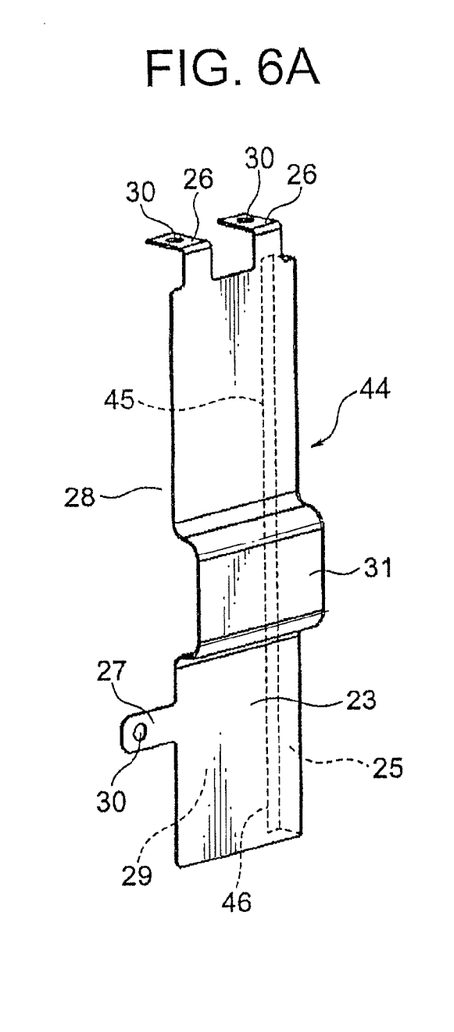
FIGS. 6A-6C are perspective views showing another example of the shield cover.
Figure 6B:
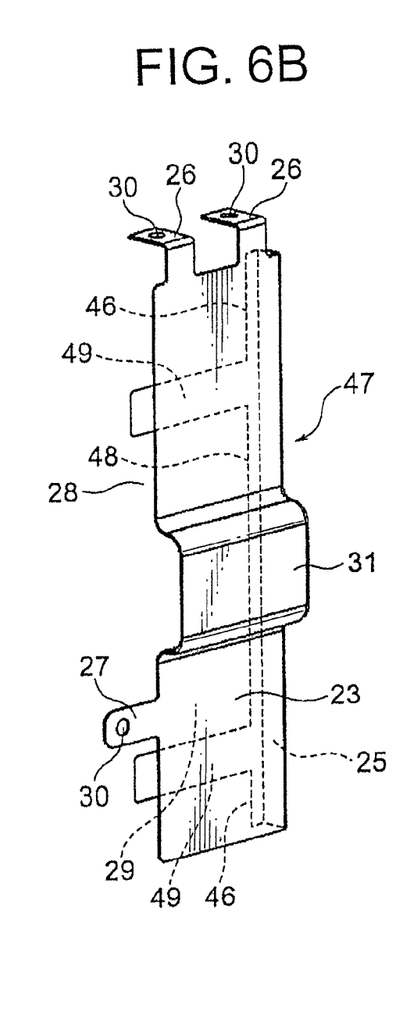
Figure 6C:
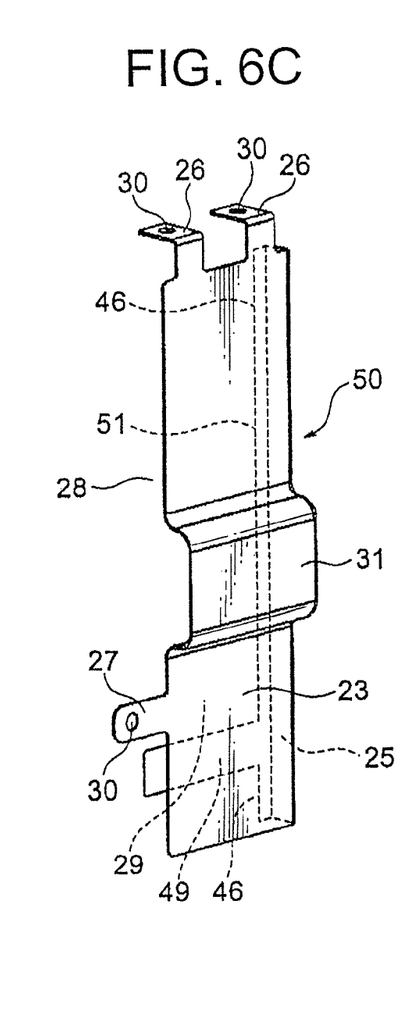

Hereafter, a third embodiment will be explained with reference to the drawings. FIG. 6 is a perspective view showing another example of the shield cover. Incidentally, for some elements same with those of the first and second embodiments, same reference numerals are used and explanations are omitted.

As shown in FIG. 6A, a shield cover 44 is formed by pressing a conductive metal plate. The shield cover 44 has the front shield portion 23, a back portion 45, the side shield portion 25, the connections 26, 27, the entry 28 (shield object member entry) and the receiving space 29 (shield object member receiving space). The front shield portion 23 is opposed to the back portion 45. The side shield portion 25 connects the right edge (one end) of the front shield portion 23 with the right edge (one end) of the back portion 45. The connection 26 is connected and fixed to the connection stand 34 of the shield case 14 (see FIG. 1), and the connection 27 is connected and fixed to the connection stand 35 of the wall-shaped shield cover 22 (see FIG. 1). The entry 28 opens at the left edge (the other end) of the front shield portion 23. The receiving portion 29 is connected to the entry 28, and formed between the front shield portion 23 and the back portion 45. The shield cover 44 is formed into a U-shape in cross-section near the back portion 45.

The back portion 45 is formed so that the back portion 45 is a reinforced portion 46 against the side shield portion 25. The reinforced portion 46 is formed, such as for example FIGS. 6A-6C, so as to maintain at least the shape of the side shield portion 25. The reinforced portion 46 (back portion 45) is connected to one end (second end) of the back surface side of the side shield portion 25. The reinforced portion 46 (back portion 45) is arranged in contact with the shield cases 14, 15 (see FIG. 1) and formed.

As shown in FIG. 6B, the shield cover 47 is formed by pressing a conductive metal plate. The shield cover 47 has the front shield portion 23, a back portion 48, the side shield portion 25, the connections 26, 27, the entry 28 (shield object member entry) and the receiving space 29 (shield object member receiving space). The front shield portion 23 is opposed to the back portion 48. The side shield portion 25 connects the right edge (one end) of the front shield portion 23 with the right edge (one end) of the back portion 48. The connection 26 is connected and fixed to the connection stand 34 of the shield case 14 (see FIG. 1), and the connection 27 is connected and fixed to the connection stand 35 of the wall-shaped shield cover 22 (see FIG. 1). The entry 28 opens at the left edge (the other end) of the front shield portion 23. The receiving portion 29 is connected to the entry 28, and formed between the front shield portion 23 and the back portion 48. The shield cover 47 is formed into a U-shape in cross-section at a position of a sliding guide portion 49 described below in the back portion 48.

The back portion 48 has the reinforced portion 46 against the side shield portion 25 and a plurality of sliding guide portions 49, and formed. In FIG. 6B, two sliding guide portions 49 are provided. The sliding guide portion 49 is formed as a guide member so as to slide the shield cover 47. The sliding guide portion 49 is arranged in contact with the shield cases 14, 15 (see FIG. 1). By forming the sliding guide portion 49 with the above shape, the shield cover 47 can be smoothly moved.

As shown in FIG. 6C, a shield cover 50 is basically formed into the same shape as the above shield cover 47. In the shield cover 50, one sliding guide portion 49 arranged in an upper side of the shield cover 47 is not provided. Furthermore, the shield cover 50 is formed with a shape smaller than the back shield portion 24. A back portion 51 of the shield cover 50 has the reinforced portion 46 and the sliding guide portion 49. The sliding guide portion 49 is formed and arranged in a size which closes the gap 33 between the shield case 14 of the motor unit 12 and the shield case 15 of the inverter unit 13 in FIG. 1. In this embodiment, the sliding guide portion 49 has the same function as the back shield portion 24 (see FIG. 1).

While, in the embodiment, the present invention is described, it is not limited thereto. Various change and modifications can be made with the scope of the present invention.

Reference Signs 11 wiring harness (shield object)
12 motor unit
13 inverter unit
14, 15 shield case
16 harness main body
17 motor side connector
18 inverter side connector
19 high-voltage conducting path
20 shield cover
21 shield structure
22 wall-shaped shield cover (another shield cover)
23 front shield portion
24 back shield portion (back portion)
25 side shield portion
26, 27 connection
28 entry (shield object member entry)
29 receiving space (shield object member receiving space)
30 screw hole
31 projection
32 flexion
33 gap
34, 35 connection stands
36 screw hole
37 projection
41 shield structure
42 second shield cover (another shield cover)
43 engaging portion
44, 47, 50 shield cover
45, 48, 51 back portion
46 reinforced portion
49 sliding guide portion

The invention claimed is:

1. A shield cover formed by processing a conductive metal plate comprising:
a side shield portion; a front shield portion whose one end is connected to a first end of the side shield portion; a projection formed from the one end of the front shield portion to the other end thereof such that an intermediate portion of the front shield portion is projected in a direction perpendicular to the ends; a back portion connected to a second end of the side shield portion and opposed to the front shield portion; a connection connected to a conductive portion; a shield object member entry opening at the other end of the front shield portion; and a shield object member receiving space connected to the shield object member entry and formed between the front shield portion and the back portion, wherein the shield cover slidably covers shield object.

2. The shield cover as claimed in claim 1, wherein the back portion is formed as at least one of a reinforced portion against the side shield portion and a sliding guide portion when the shield cover is slid.

3. The shield cover as claimed in claim 1, wherein the back portion formed in a desired size and a desired arrangement is a back shield portion.

4. A shield structure comprising:
a shield cover described in claim 1; and
an other shield cover engaged with the shield cover so as to cover the shield object member entry of the shield cover.

5. The shield structure as claimed in claim 4, wherein the other shield cover is formed into a wall shape.

6. The shield structure as claimed in claim 4, wherein the other shield cover is a second shield cover having a structure of the shield cover, and the second shield cover being formed slidable in a direction opposite to a sliding direction of the shield cover.

7. The shield structure as claimed in claim 6, wherein the second shield cover covers second shield object.

* * * * *